United States Patent
DiTommaso (10) Patent No.: US 6,366,115 B1
(45) Date of Patent: Apr. 2, 2002

(54) BUFFER CIRCUIT WITH RISING AND FALLING EDGE PROPAGATION DELAY CORRECTION AND METHOD

(75) Inventor: Vincenzo DiTommaso, Watertown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/789,966

(22) Filed: Feb. 21, 2001

(51) Int. Cl.[7] .......................... H03K 19/003; H03B 1/00
(52) U.S. Cl. ............................ 326/32; 326/26; 326/27; 326/88; 327/108; 327/109; 327/170
(58) Field of Search .............................. 326/26, 27, 32, 326/88; 327/108, 109, 170

(56) References Cited

U.S. PATENT DOCUMENTS 6,222,354 B1 * 4/2001 Song ........................... 323/273

6,246,270 B1 * 6/2001 Wang et al. ................. 327/111

* cited by examiner

*Primary Examiner*—Michael Tokar
*Assistant Examiner*—Vibol Tan
(74) *Attorney, Agent, or Firm*—Koppel & Jacobs (57) ABSTRACT

A buffer circuit includes a delay circuit which is interposed between a signal source and a following circuit. The delay circuit propagates a signal from an input to an output; the signal has associated desired timing relationships between its rising and falling edges. The delay circuit controls the propagation delays of the signal's rising and falling edges such that when the signal arrives at a selected downstream node, it has the desired timing relationships. The delay circuit adjusts the propagation delays in accordance with two correction signals: one which reduces errors induced by imperfections in the signal path through which the test signal propagates, and one to reduce errors due to thermal effects that arise when propagating a periodic test signal having a duty cycle other than 50% through the signal path.

21 Claims, 8 Drawing Sheets

BUFFER CIRCUIT WITH RISING AND FALLING EDGE PROPAGATION DELAY CORRECTION AND METHOD

BACKGROUND OF THE INVENTION

1. Field of the Invention

This invention relates to the field of buffer circuits capable of modifying the propagation delays of rising and falling edges propagating through a signal path.

2. Description of the Related Art

Automatic test equipment (ATE) is often used to test electronic circuitry. This is done by applying a variety of stimuli to a device to be tested, referred to herein as a "device-under-test" (DUT), and monitoring the DUT's responses.

Figure 1:
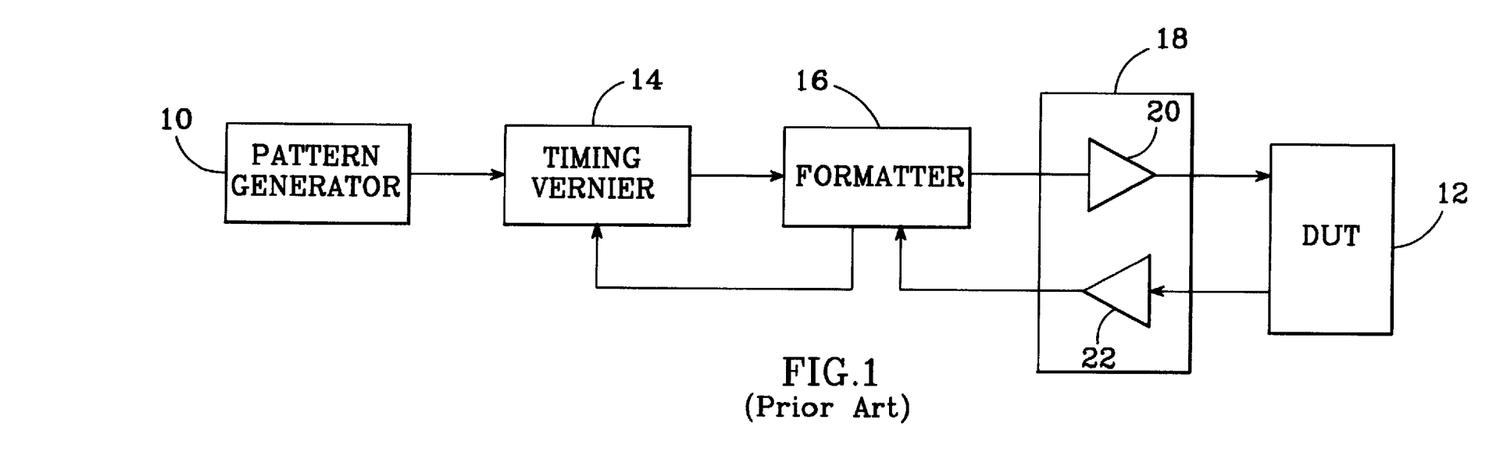
FIG. 1 is a block diagram of a known ATE system.

The stimuli takes the form of test signals having predefined characteristics, which are applied to the DUT in a predetermined manner. A typical ATE system is shown in FIG. 1. A pattern generator 10 stores digital information representing the characteristics, such as duty cycle, frequency, amplitude, etc., of the test signals to be provided to a DUT 12. This information is provided to a timing vernier 14, which generates signal edges and/or pulses in accordance with the digital information. These are passed onto a formatter, which combines the edges and pulses into the desired waveforms.

The formatter output is typically provided to a "pin electronics IC" 18, which provides an interface between the ATE and the DUT. The pin electronics IC includes one or more driver circuits 20, which enable the test signals to be applied to the DUT at the voltage and current levels required by the device. IC 18 also typically includes one or more comparator circuits 22, which are used to monitor respective DUT outputs.

Unfortunately, errors may be introduced into the test signals as they propagate through the ATE system. For example, rising and falling edges may be delayed by different amounts as they propagate through the ATE. As used herein, the propagation delay of a test signal's rising edge through a given signal path is referred to herein as "TPDLH" (total propagation delay low-to-high), and the propagation delay of its falling edge is referred to as "TPDHL" (total propagation delay high-to-low). When TPDLH and TPDHL are unequal, pulse width and/or duty cycle errors arise in the test signals actually applied to the DUT 12. Discrepancies between TPDLH and TPDHL values can be induced by the signal path through which the test signal propagates, due to imperfections or mismatches in IC 18, its preceding circuits, and/or its following circuits; such errors are referred to herein as "signal path errors". The TPDLH and TPDHL values can also be adversely affected by thermal effects that arise when propagating a periodic test signal having a duty cycle other than 50% through the signal path, due to the unequal heating of transistors in the signal path; errors of this type are referred to herein as "temperature-related errors".

SUMMARY OF THE INVENTION

A buffer circuit and method are presented which overcome the problems noted above, reducing both signal path and temperature-related errors in many timing-critical applications. The invention is particularly well-suited for use in ATE systems as described above.

The buffer circuit includes a delay circuit which is interposed between a signal source and a following circuit. For example, in an ATE system, the delay circuit may be interposed between the output of an ATE system's formatter and its drivers. The delay circuit propagates a signal from an input to an output; the signal has associated desired timing relationships between its rising and falling edges. The delay circuit adjusts the propagation delays of the signal's rising and falling edges such that when the signal has propagated to a selected downstream node, it has the desired timing relationships. For example, in an ATE system, the test signals applied to a DUT might be monitored for duty cycle errors, and the delay circuit arranged to adjust the propagation delay of the test signals' rising and falling edges such that the duty cycle errors detected at the DUT are reduced.

In a preferred embodiment, the buffer circuit receives signals having true and complement forms, and produces true and complement outputs. The received signals are connected to a first differential transistor pair, with the true and complement signals propagated to the output via a second differential transistor pair and an output stage. The rising and falling edge propagation delays are adjusted by means of a clamp circuit connected to the second pair's inputs which controls the voltage swing at each input. Respective capacitors are also connected to the second pair's inputs, each of which linearizes the slope of a transitioning signal and extends the propagation delay adjustment range.

The clamp circuit establishes the voltage swings—and thereby the propagation delays—in accordance with two correction signals: one to reduce signal path errors, and one to reduce temperature-related errors. Signal path errors are detected by monitoring the timing relationships between the propagating signal's rising and falling edges at the selected downstream node under controlled conditions. The signal path error correction signal is generated to reduce the error detected at the downstream node.

Temperature-related errors vary with the desired duty cycle of a propagating signal which is periodic. Therefore, the temperature-related error correction signal is generated by detecting the signal's desired duty cycle, and varying the correction signal in accordance with the detected duty cycle.

Further features and advantages of the invention will be apparent to those skilled in the art from the following detailed description, taken together with the accompanying drawings.

DETAILED DESCRIPTION OF THE INVENTION

Figure 2:
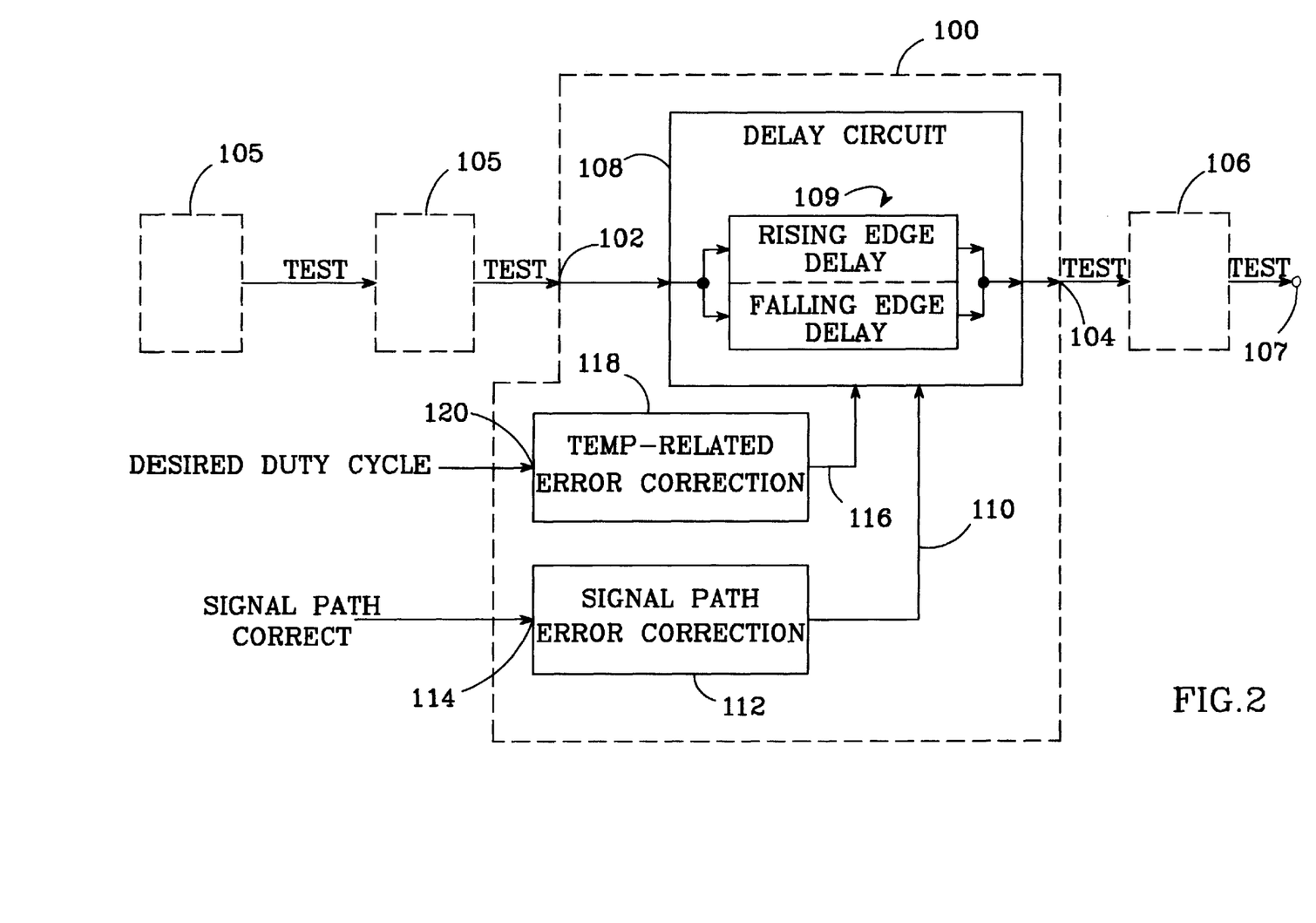
FIG. 2 is a block diagram of a buffer circuit in accordance with the present invention.

A buffer circuit 100 in accordance with the present invention is shown in FIG. 2. The buffer circuit includes an input 102 which is connected to receive a signal TEST, and an output 104 by which TEST is propagated to a following circuit. The TEST signal has associated desired timing relationships between its rising and falling edges; i.e., the desired timing between the TEST signal's rising and falling edges is precisely defined. The buffer circuit is part of a "signal path" through which TEST propagates, which can also include circuitry 105 upstream of the present buffer circuit's input which is involved in generating or processing the signal, as well as circuitry 106 downstream of buffer circuit 100. The signal path terminates at a predetermined downstream node 107. Note that the predetermined downstream node might be defined as the output of buffer circuit 100, or may be the output of a circuit well downstream of the buffer circuit output. As used herein, the "predetermined downstream node" is a node at which a propagating signal is used, and therefore should have the desired timing relationships.

As noted above, timing errors are introduced into the propagating TEST signal when the signal path's TPDLH and TPDHL values are unequal. The present buffer circuit enables the signal path's TPDLH and TPDHL values to be made equal, such that timing errors incurred along the signal path can be reduced and the desired timing relationships thereby achieved at predetermined downstream node 107.

The invention is particularly well-suited to use in an ATE system, in which signals having precisely-defined timing characteristics are to be applied to a DUT. In this application, the signal received at input 102 is to be propagated via output 104 to a DUT, typically through a driver circuit (not shown). Here, the predetermined downstream node is at the DUT, and buffer circuit 100 enables the propagating test signal to have the desired timing relationships when applied to the DUT.

Buffer circuit 100 includes a delay circuit 108 which is arranged to propagate a signal presented at input 102 to output 104. The delay circuit includes circuitry 109 which controls the propagation delays of rising and falling edges that occur at input 102. By controlling the rising and falling edge delays appropriately, delay circuit 106 affects the timing of TEST signal transitions such that the timing relationships between the signal's rising and falling edges at output 104 can differ from those at input 102. When the delays are adjusted properly, TPDLH and TPDHL are made equal, and the signal propagated to predetermined downstream node 107 has the desired timing relationships.

The rising and falling edge delays are varied in accordance with two correction signals received by circuitry 109. A first correction signal 110 is provided by a signal path error correction circuit 112, which corrects "signal path errors" that, as noted above, arise due to imperfections in the signal path through which TEST propagates. Such errors are typically detected at the predetermined downstream node at which the signal is used. For example, assume that the output 104 of buffer circuit 100 is connected to a following circuit 106, which drives predetermined downstream node 107. Further assume that a TEST signal pulse has a desired duration of 1 ns and is to be propagated to downstream node 107. When applied to input 102, the TEST signal has a duration of 1 ns, but when propagated to predetermined downstream node 107 has a duration of 1.05 ns. This 5% error in pulse width is incurred as TEST propagates through delay circuit 108 and following circuit 106, and is thus a signal path error. Signal path error correction circuit 112 varies its correction signal output 110 in accordance with a SIGNAL PATH CORRECT signal received at an input 114. In practice, the magnitude of the signal path error at predetermined downstream node 107 is determined, and the SIGNAL PATH CORRECT signal is set to produce a correction signal 110 which acts to reduce the signal path error at the predetermined downstream node.

A second correction signal 116 is provided by a temperature-related error correction circuit 118, which corrects "temperature-related errors" that, as noted above, arise due to thermal effects that occur when propagating a periodic signal having a duty cycle other than 50% through a signal path. A duty cycle other than 50% can result in some of the transistors propagating TEST to become hotter than others; this can cause TPDLH and TPDHL to become unequal and a duty cycle error to be introduced, the magnitude of which varies with TEST's duty cycle. To reduce this type of error, temperature-related error correction circuit 118 receives a signal (DESIRED DUTY CYCLE) at an input 120 which represents the duty cycle desired at predetermined downstream node 107, detects the duty cycle of the DESIRED DUTY CYCLE signal, and varies correction signal 116 with the detected duty cycle such that temperature-related errors are reduced. DESIRED DUTY CYCLE input 120 would typically be connected to a point in the signal path at which temperature-related errors are minimal; for example, at input 102 to buffer circuit 100, or at a point in the signal path upstream of the buffer circuit. The invention also contemplates the possibility of connecting DESIRED DUTY CYCLE input 120 to buffer circuit output 104 or to a downstream node.

The present invention is well-suited for use with data signals having frequencies in the gigahertz range, where the ability to provide precise pulse widths is very difficult. Since speed and accuracy are of utmost importance in such applications, delay circuit 108 is preferably implemented with bipolar transistors and propagates differential signals.

Figure 3A:
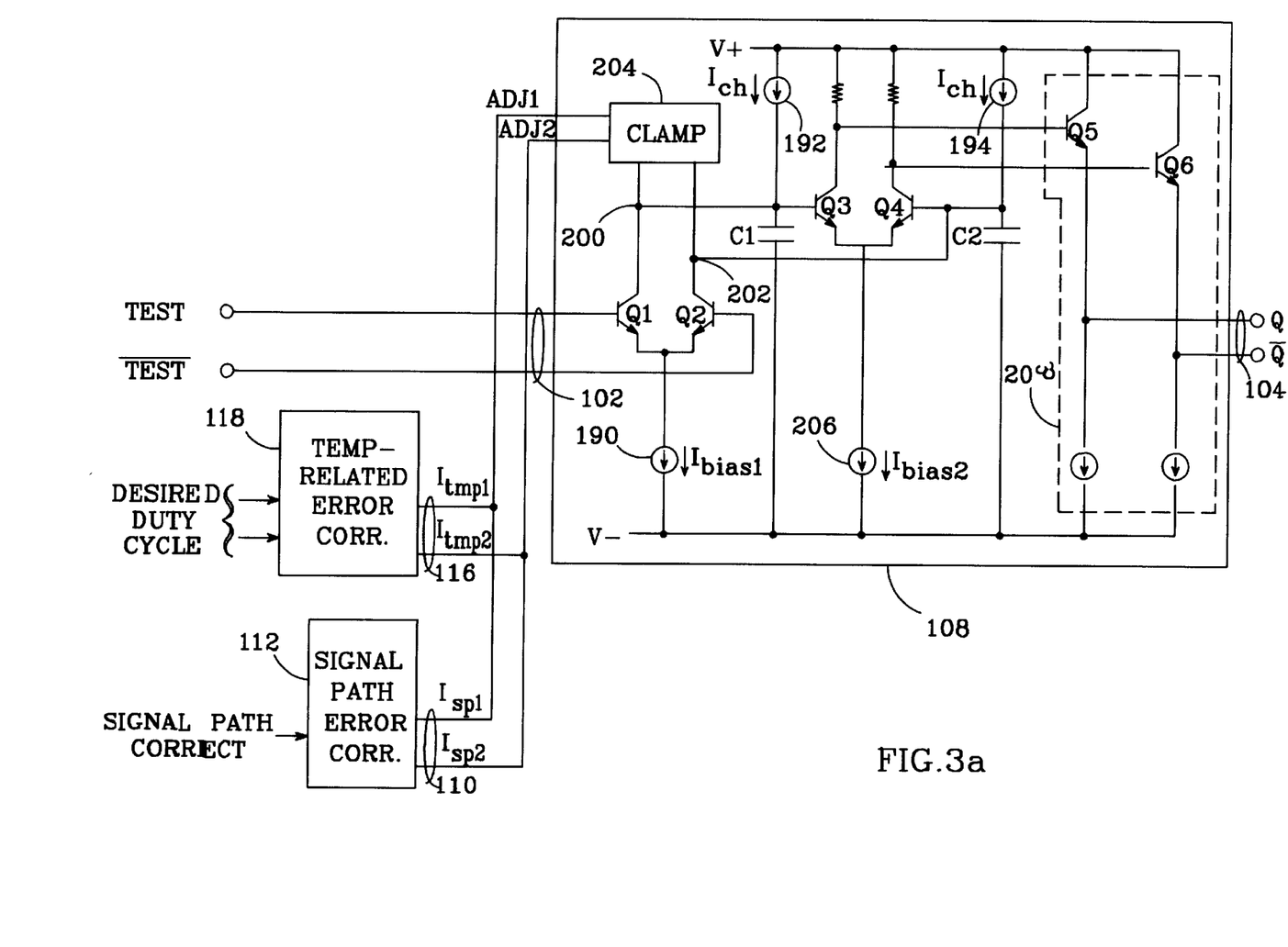
FIG. 3a is a block/schematic diagram of a buffer circuit in accordance with the present invention.

Such an embodiment is shown in FIG. 3a. Here, the TEST signal is differential, provided in true (TEST) and complement ($\overline{\text{TEST}}$) forms to the buffer circuit's input 102, which are connected to the respective bases of a differential pair Q1 and Q2 within delay circuit 108. The pairs' emitters are connected to a current source 190 which conducts a common bias current $I_{bias1}$ and their collectors are connected to respective current sources 192 and 194 which provide equal currents $I_{ch}$ at respective junctions 200 and 202. Also connected to junctions 200 and 202 are a clamp circuit 204, a pair of capacitors C1 and C2, and the bases of a second differential pair Q3 and Q4, respectively. The emitters of Q3 and Q4 are connected to a current source 206 which conducts a common bias current $I_{bias2}$, and their collectors are connected to respective load resistors and to the respective bases of a pair of buffer transistors Q5 and Q6 which form part of an output stage 208. The voltages present at the bases of Q5 and Q6 are buffered to the circuit's differential outputs 104, identified here as Q and $\overline{Q}$, respectively.

Figure 3B:
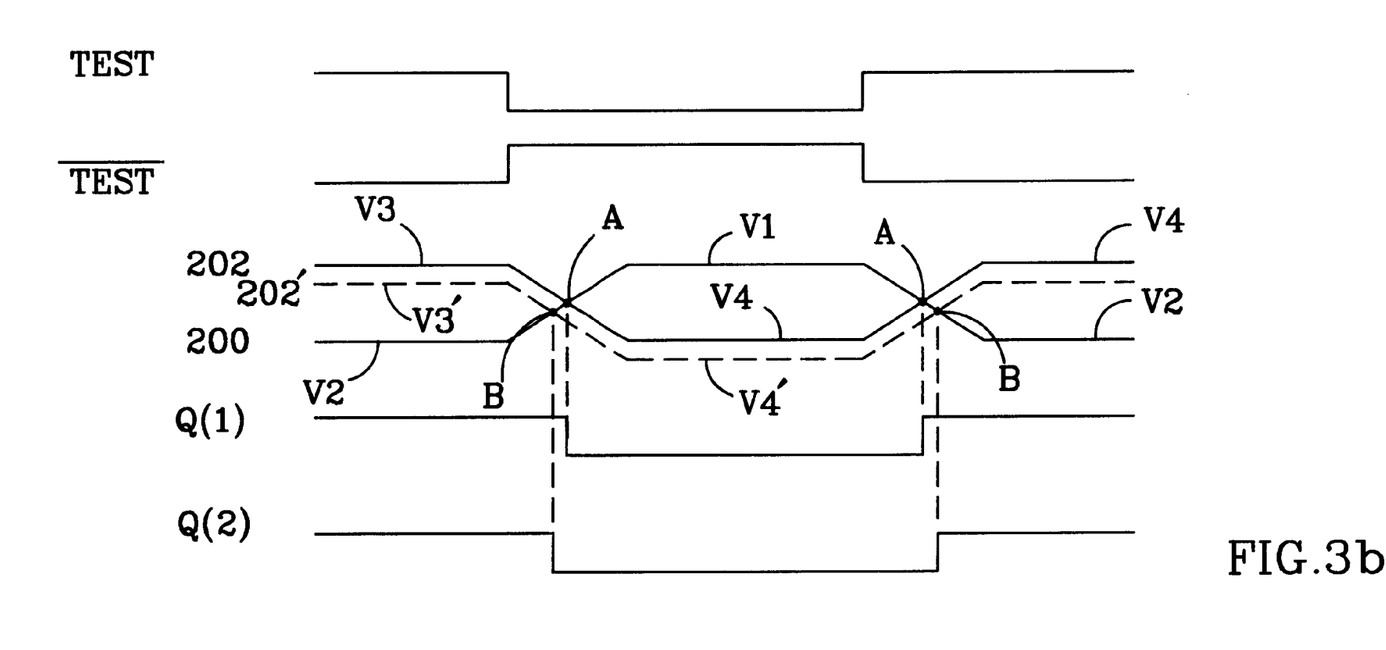
FIG. 3b is a timing diagram illustrating the operation of the present buffer circuit.

Clamp circuit 204 is used to control the voltage swing of the signals applied to the bases of Q3 and Q4. By imposing respective upper and lower clamp voltages on each junction, the propagation delay of a signal through delay circuit 108 can be varied. This is illustrated in FIG. 3b. Initially, TEST is high and $\overline{\text{TEST}}$ is low, which turns Q1 on to pull junction 200 low, and turns Q2 off so that junction 202 is high. When TEST and $\overline{\text{TEST}}$ change state, Q2 is turned on, Q1 is turned off, and junctions 200 and 202 begin to change state at a rate determined by the capacitance at each node. The process is repeated when TEST goes high and $\overline{\text{TEST}}$ goes low, with junctions 200 and 202 ramping back to their initial voltages.

Junctions 200 and 202 ramp between upper and lower voltages established by clamp circuit 204, which imposes upper clamp voltage V1 and lower clamp voltage V2 on junction 200 (and the base of Q3), and upper clamp voltage V3 and lower clamp voltage V4 on junction 202 (and the base of Q4). When V1=V3 and V2=V4, the bases of Q3 and Q4 will have identical voltage swings. Under these conditions, when TEST and $\overline{\text{TEST}}$ change state, the ramping voltages at junctions 200 and 202 cross at a point "A" (i.e., the "crossing point"), which occurs at about the halfway point of the transition ramp. Q3 and Q4 change state as the ramping voltages pass through the crossing point, resulting in an output waveform Q(1) which has a pulse width equal to that of input signals TEST and $\overline{\text{TEST}}$.

If, however, V1 and V3 and/or V2 and V4 are made unequal, the propagation delays are modified. An example is shown in FIG. 3b: here, clamp voltages V3 and V4 (identified as V3' and V4') are made less than V1 and V2, respectively, resulting in a waveform 202' at junction 202. The lowered 202' waveform changes the points in time at which the two waveforms (200 and 202') cross—identified in FIG. 3b as crossover points "B"—with the first crossover point B occurring earlier in time than the corresponding A point, and the second crossover point B occurring later in time that the corresponding A point. This results in output waveform Q(2), which has a wider pulse width than that of TEST or $\overline{\text{TEST}}$, or of Q(1). Thus, by manipulating the clamp voltages, the pulse width of a propagating signal is increased or decreased as necessary to achieve the desired timing relationships.

Referring back to FIG. 3a, capacitors C1 and C2 and current sources 192 and 194 are included to linearize the slopes of the transition ramps between clamp voltages, which would otherwise be uncontrolled. $I_{bias1}$ is preferably made equal to $2*I_{ch}$; this gives the Q1/Q2 differential pair a switch current of $2*I_{ch}$, such that at any given instant one of the capacitors will be charging while the other is discharging with $I_{ch}$. The addition of capacitors C1 and C2 also extends the TPDLH and TPDHL adjustment range over which the delay circuit is effective. Note, however, that extending the adjustment range lowers the maximum frequency of the signals which the delay circuit can accurately propagate; thus, the maximum frequency of the propagating signals must be considered when sizing C1 and C2 and current sources 192 and 194.

With the values of C1 and C2 known, the effect of clamp circuit 204 on the rising and falling edge delays can be determined in accordance with the following equations: when V1≠V3, the rising edge delay will be reduced by a time T1 given by:

$$T1=(V3-V1)*(C1/I_{ch})$$

and when V2≠V4, the falling edge delay will be reduced by a time T2 given by:

$$T2=(V4-V2)*(C2/I_{ch})$$

Thus, by controlling clamp voltages V1 through V4, the rising and falling edge propagation delays through delay circuit 108 can be adjusted such that the signal path's TPDLH and TPDHL values are made equal, thereby ensuring that the TEST and $\overline{\text{TEST}}$ signals arriving at the predetermined downstream node have the desired timing relationships.

In the embodiment shown in FIG. 3a, the correction signal 110 produced by signal path error correction circuit 112 comprises two currents, $I_{sp1}$ and $I_{sp2}$, and the correction signal 116 produced by temperature-related error correction circuit 118 comprises two currents, $I_{tmp,1}$ and $I_{tmp2}$. $I_{sp1}$ and $I_{tmp1}$ are summed together to produce a current ADJ1, and $I_{sp2}$ and $I_{tmp2}$ are summed together to produce a current ADJ2; ADJ1 and ADJ2 are provided to clamp circuit 204. Clamp circuit 204 is arranged to establish upper and lower voltage limits on each of junctions 200 and 202, with the limits on junction 200 varying with ADJ1 and the limits on junction 202 varying with ADJ2.

Note that the delay circuit schematic shown in FIG. 3a is merely exemplary; the invention only requires the ability to adjust the rising and falling edge delays of a propagating data signal in accordance with one or more correction signals designed to reduce signal path and temperature-related errors. For example, though shown implemented with bipolar transistors, delay circuit 108 could also employ CMOS pairs.

Figure 4:
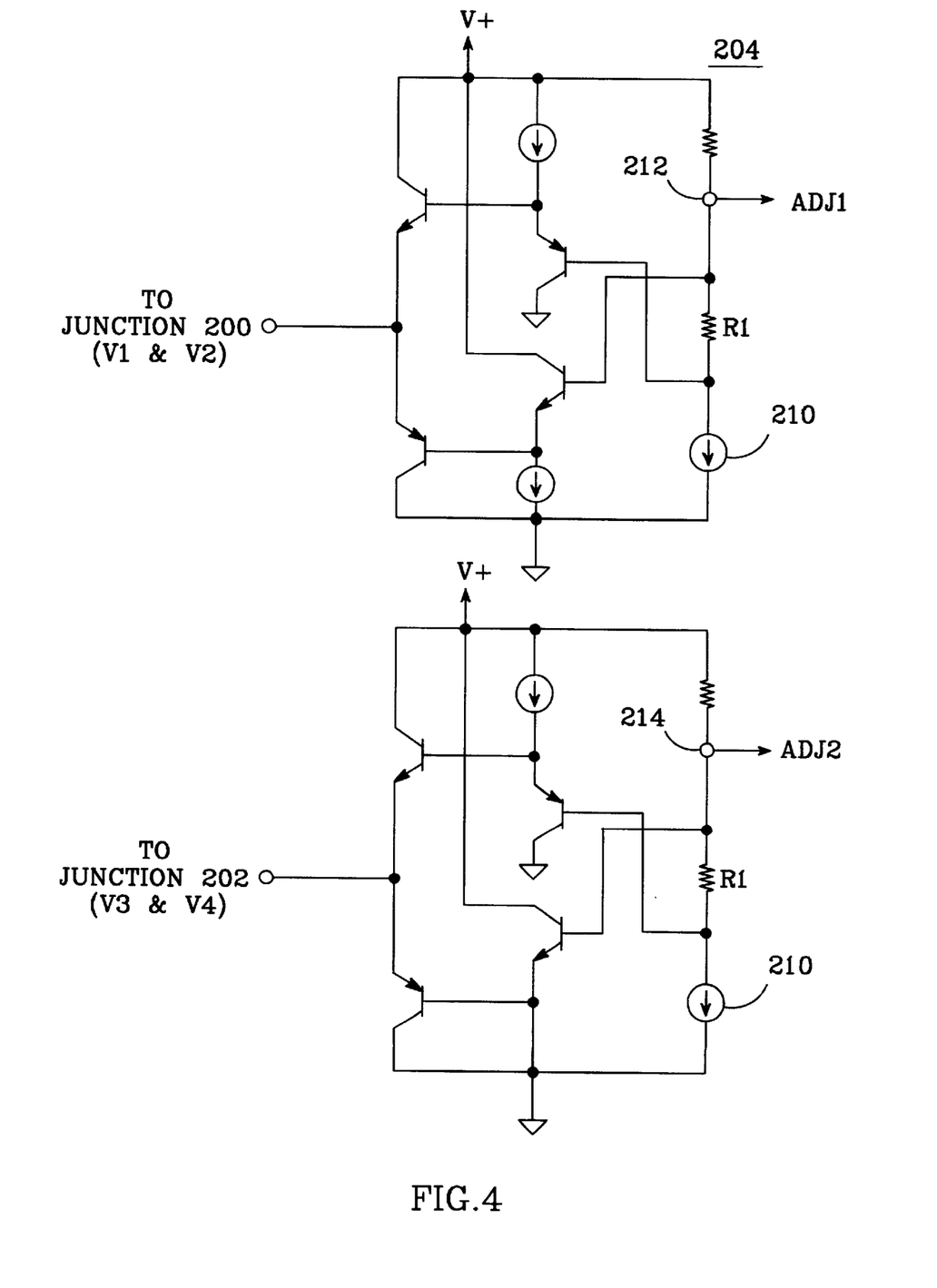
FIG. 4 is a schematic diagram of one possible embodiment of a clamp circuit as might be employed in the present buffer circuit.

Clamp circuits as described above, which establish clamp voltages in accordance with the value of one or more input currents, are known in the analog circuit arts. One possible embodiment of such a clamp circuit is shown in FIG. 4. As shown, clamp circuit 204 includes 2 identical subcircuits, each of which is connected to one of the correction currents ADJ1 and ADJ2. Each subcircuit comprises a current source 210, which causes a fixed current to flow in a resistor R1 to create a differential voltage, which is buffered through two complementary transistor pairs to an output which is connected to one of junctions 200 or 202. The product of the fixed current and the value of R1 establishes the voltage between the upper and lower clamp voltages. The two R1 resistors are also connected to a supply voltage V+ via respective resistors at respective nodes 212 and 214, which are connected to currents ADJ1 and ADJ2, respectively. The voltages at nodes 212 and 214, and thus the upper and lower clamp voltages, are shifted up and down in accordance with the magnitudes of ADJ1 and ADJ2. Note that the clamp circuit shown in FIG. 4 is merely exemplary; many other designs, including CMOS designs, could be employed to provide upper and lower clamp voltages that vary with an input signal.

Figure 5:
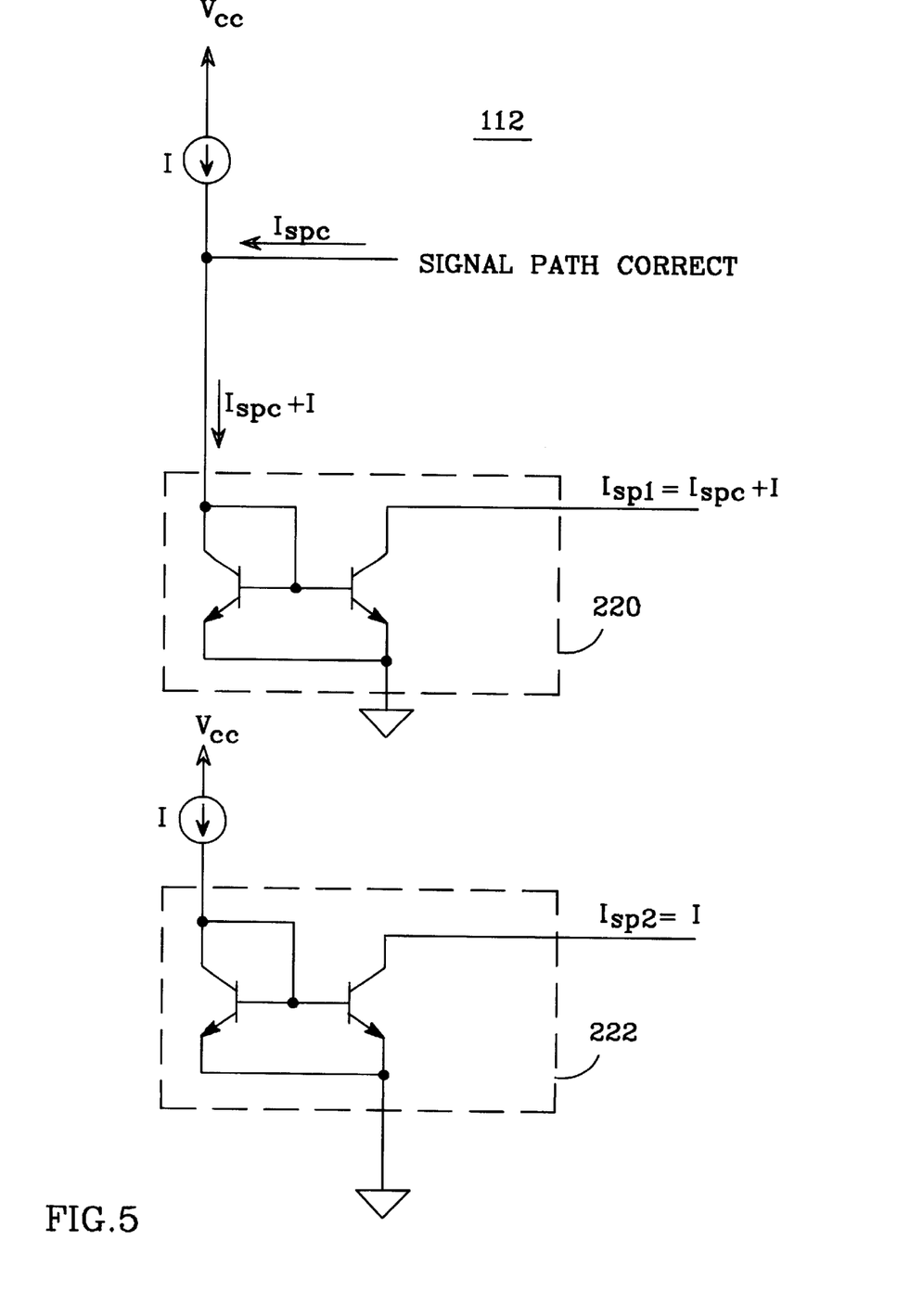
FIG. 5 is a schematic diagram of one possible embodiment of a signal path error correction circuit in accordance with the present invention.

A schematic of one possible embodiment of signal path error correction circuit 112 is shown in FIG. 5. A current I and a current $I_{spc}$ are summed, in which $I_{spc}$ is the SIGNAL PATH CORRECT signal provided to the signal path error correction circuit 112, and I is a fixed current. The summed currents are mirrored with a current mirror 220 to produce $I_{sp1}$, which is given by $I_{spc}+I$. $I_{sp2}$ is produced by another current mirror 222 which is driven with a fixed current I, such that $I_{sp2}$ is equal to I. Thus, signal path error correction circuit 112 provides a differential current that varies with $I_{spc}$, with the difference between $I_{sp1}$ and $I_{sp2}$ given by $I_{spc}$. Clamp circuit 204 is arranged to receive the $I_{sp1}$ and $I_{sp2}$ components of correction signals ADJ1 and ADJ2, and to vary the clamp voltages, and thereby the rising and falling edge delays for the propagating TEST and $\overline{\text{TEST}}$ signals, accordingly. The determination of the proper value of the SIGNAL PATH CORRECT current ($I_{spc}$) is discussed below.

Note that the implementation of signal path error correction circuit 112 shown in FIG. 5 is merely exemplary. A proper design is application-specific, depending, for example, on the particular clamp circuit design and the anticipated range of error that is to be corrected.

Figure 6A:
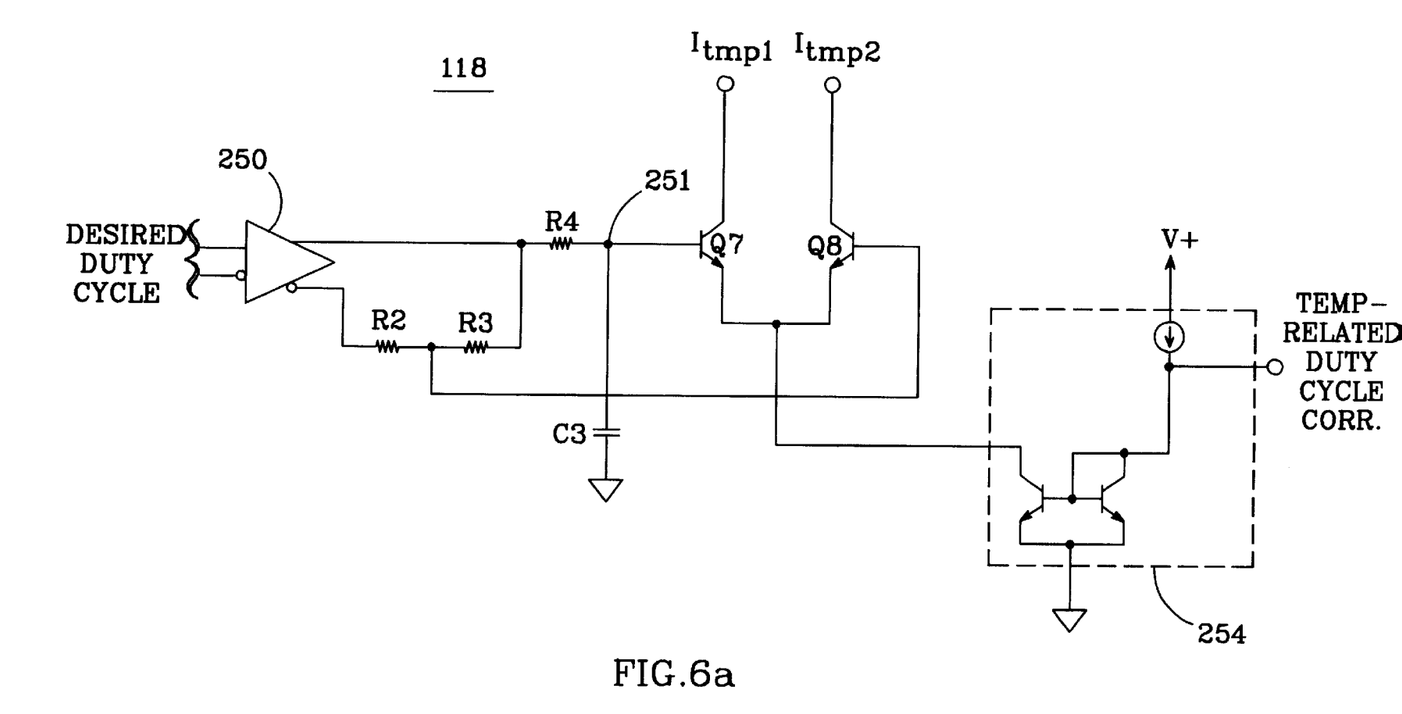
FIG. 6a is a schematic diagram of one possible embodiment of a temperature-related error correction circuit in accordance with the present invention.

A schematic of one possible embodiment of temperature-related error correction circuit 118 is shown in FIG. 6a. A differential DESIRED DUTY CYCLE signal is applied to a buffer amplifier 250 which provides a differential output. As noted above, the DESIRED DUTY CYCLE signal preferably has a duty cycle equal to that desired at the predetermined downstream node. A pair of resistors R2 and R3 form a resistive divider between the differential outputs, which produces a fixed voltage at their junction. The buffered DESIRED DUTY CYCLE signal is applied to an RC network comprising resistors R4 and C3, the values of which are chosen to provide an RC time constant which is equal to the thermal time constant of the transistors in the TEST and $\overline{\text{TEST}}$ signals' signal paths. That is, if the signal path transistors have a thermal time constant of 1 μs, R4 and C3 should be chosen such that R3*C3=1 μs. The voltage at the junction 251 of R4 and C3 varies with the duty cycle of the DESIRED DUTY CYCLE signal; in this way, the duty cycle of the DESIRED DUTY CYCLE signal is "detected".

The duty cycle-related voltage at junction 251 and the fixed voltage at the R2/R3 junction are applied to a differential pair made up of transistors Q7 and Q8, each of which is arranged to operate in its linear region. In response, Q7 and Q8 conduct a differential current comprising $I_{tmp1}$ and $I_{tmp2}$, the magnitude of which varies with the detected duty cycle. $I_{tmp1}$ and $I_{tmp2}$ are preferably summed with $I_{sp1}$ and $I_{sp2}$ to produce ADJ1 and ADJ2.

If the magnitude and direction of a signal path's temperature-related error is well-understood, a fixed bias current can be connected to the common emitters of Q7 and Q8, thereby providing a fixed gain for the correction current. However, if some flexibility is desired, the gain of circuit 118 can be made adjustable. This can be accomplished by, for example, varying the bias current applied to the common emitters of Q7 and Q8. One method of doing this is shown in FIG. 6a, in which the bias current applied to the emitters of Q7 and Q8 is provided by a variable current source 254 which is controlled with an input signal TEMP-RELATED DUTY CYCLE CORRECT, the adjustment of which will vary the gain of the correction current.

Figure 6B:
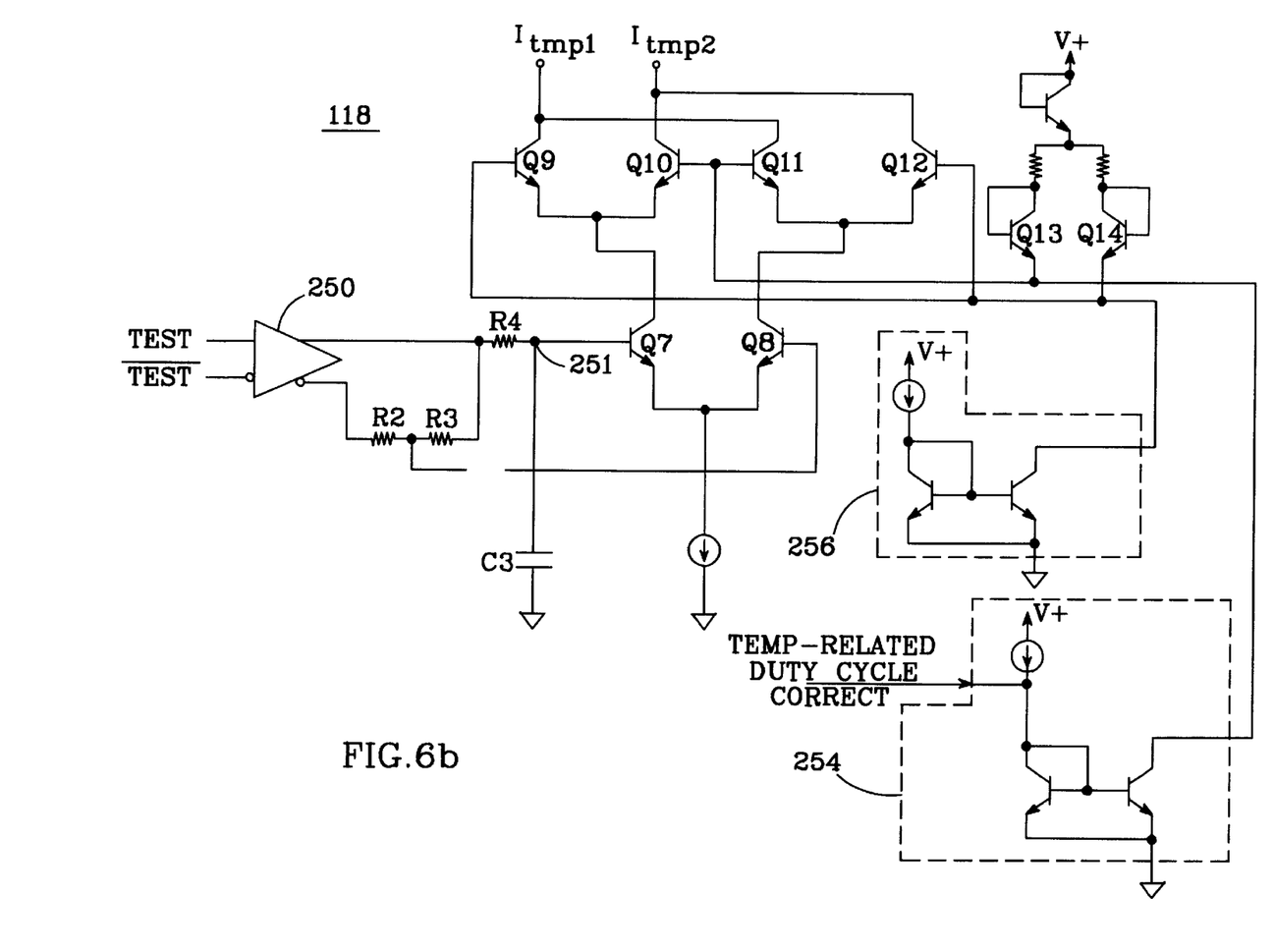
FIG. 6b is a schematic diagram of a preferred embodiment of a temperature-related error correction circuit in accordance with the present invention.

A preferred embodiment of temperature-related duty cycle error correction circuit 118 is shown in FIG. 6b. The basic circuit is identical to that shown in FIG. 6a, except that the differential current conducted by pair transistors Q7 and Q8 is routed through cross-coupled transistors Q9, Q10, Q11 and Q12 to correction current outputs $I_{tmp1}$ and $I_{tmp2}$. Transistors Q9 through Q12 serve as a "gain selector", in that they control how much of the Q7 and Q8 currents are routed to $I_{tmp1}$ and $I_{tmp2}$, which is established by the voltages applied to the bases of each of Q9 through Q12. For example, if the voltages applied to the bases of Q9 and Q10 are equal, half of the Q7 current is routed to $I_{tmp1}$ and half to $I_{tmp2}$, and half of the Q8 current is routed to $I_{tmp1}$ and half to $I_{tmp2}$.

The base voltages applied to Q9 through Q12 are preferably provided by circuitry similar to that shown in FIG. 5. The bases of Q10 and Q11 are connected to the output of current source 254, which varies with input signal TEMP-RELATED DUTY CYCLE CORRECT; the bases of Q9 and Q12 are connected to a fixed current source 256. The differential output current provided by sources 254 and 256 flows through a pair of transistors Q13 and Q14, which provide voltages to the Q9 through Q12 bases that change with the log of the change in current through Q13 and Q14. This linearizes the Q9/Q10 and Q11/Q12 pairs, as the exponential nature of their collector currents is canceled by the log function.

The value of TEMP-RELATED DUTY CYCLE CORRECT determines the gain of circuit 118: an increase in this signal results in an increase in the magnitude of the difference between $I_{tmp1}$ and $I_{tmp2}$ for a given output from Q7 and Q8. As $I_{tmp1}$ and $I_{tmp2}$ also vary with the inputs to Q7 and Q8, which vary with the detected duty cycle, temperature-related duty cycle errors are reduced by correction signal 116 even when the detected duty cycle varies.

Note that the implementations of temperature-related error correction circuit 118 shown in FIG. 6 are merely exemplary; many other circuits might be employed to produce a correction signal which varies with the duty cycle of an input signal such that temperature-related duty cycle errors are reduced.

For proper correction of signal path and temperature-related errors, the signal path must be calibrated. The signal path error correction circuit 112 is preferably calibrated first. TEST and $\overline{\text{TEST}}$ signals having a 50% duty cycle are applied to the buffer circuit, or to a point in the signal path upstream of the buffer circuit, and the duty cycle at the buffer circuit output, or at a point downstream of the buffer circuit, is monitored. Any point in the signal path from the buffer circuit output down can be monitored for duty cycle errors. Preferably, however, they are monitored at the predetermined downstream node at which the accuracy of the signal's timing relationships is most critical—such as at the DUT in an ATE system. The SIGNAL PATH CORRECT signal is adjusted until a 50% duty cycle is obtained at the node being monitored. As the duty cycle at the downstream node will be 50% only when the signal path's TPDLH and TPDHL values are equal, this SIGNAL PATH CORRECT adjustment will effectively correct signal path-related propagation delay variations for both periodic and non-periodic signals.

SIGNAL PATH CORRECT can be provided by, for example, a digital-to-analog converter (DAC) which has an appropriate input word applied to its digital input, or by a circuit designed to detect the duty cycle of a periodic signal at the predetermined downstream node, and to generate the SIGNAL PATH CORRECT signal in response.

The temperature-related error correction circuit 118 is calibrated similarly. TEST and $\overline{\text{TEST}}$ signals having a known duty cycle other than 50% are applied to the buffer circuit, or to a point in the signal path upstream of the buffer circuit, and the duty cycle at a predetermined downstream node is monitored; this provides both thermal time constant and temperature-related error information. Based on this data, the values of R4 and C3 in circuit 118 can be properly selected. Then, the TEMP-RELATED DUTY CYCLE CORRECT signal is adjusted until the correct duty cycle is obtained at the monitored node. TEMP-RELATED DUTY CYCLE CORRECT can be provided by, for example, a circuit designed to automatically generate the TEMP-RELATED DUTY CYCLE CORRECT based on the duty cycle detected at the monitored node. Once calibrated in this way for both signal path and temperature-related errors, the buffer circuit should keep the signal path's TPDLH and TPDHL values equal for a wide variety of signals.

Figure 7:
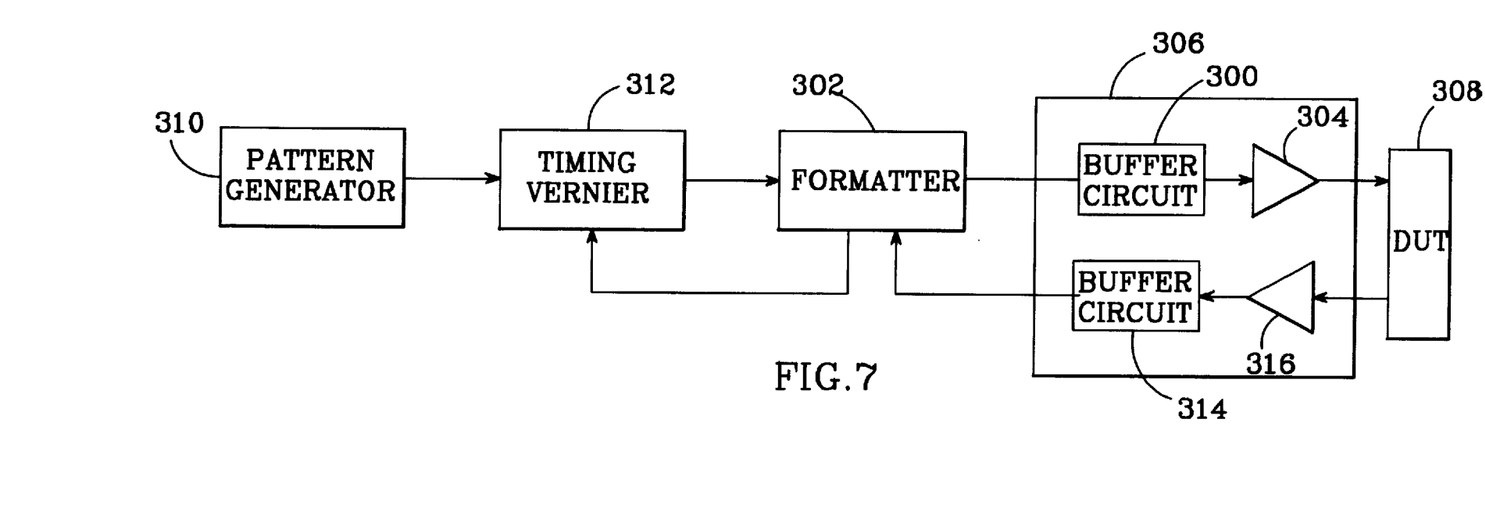
FIG. 7 is a block diagram of an ATE system which employs the present buffer circuit.

In FIG. 7, the present buffer circuit 300 is shown in an ATE application, interposed between the output of a formatter 302 and the driver circuit 304 of an ATE system. The buffer circuit may be contained with the pin electronics IC 306 as shown here, or be external to it. As in FIG. 1, the ATE system provides signals to and receives signals from a DUT 308, and typically includes a pattern generator 310 and a timing vernier 312. A second buffer circuit 314 might also be employed in this application, connected to correct timing errors found in the outputs of comparators 316 which receive signals from the DUT.

While particular embodiments of the invention have been shown and described, numerous variations and alternate embodiments will occur to those skilled in the art. Accordingly, it is intended that the invention be limited only in terms of the appended claims.

I claim:

1. A buffer circuit for correcting signal path and temperature-related timing errors present in a propagating signal, comprising:

a signal path for conveying a test signal to a predetermined downstream node, said test signal having associated desired timing relationships between its rising and falling edges, a delay circuit in said signal path, comprising:
an input connected to receive said test signal,
an output,
a rising edge delay circuit connected between said input and output,
a falling edge delay circuit connected between said input and output, said delay circuit arranged to receive first and second error correction signals and to propagate said test signal from said input to said output with said test signal's rising and falling edges delayed by said rising and falling edge delay circuits, respectively, with the duration of said delays varying in accordance with said correction signals, said test signal propagated via said signal path from said delay circuit output to said predetermined downstream node, said test signal at said predetermined downstream node having timing relationships between its rising and falling edges, a signal path error correction circuit arranged to produce said first error correction signal such that the error between said desired timing relationships and said timing relationships at said predetermined downstream node induced by the signal path followed by said test signal as it propagates to said predetermined downstream node is reduced, and a temperature-related error correction circuit arranged to produce said second error correction signal such that the error between said desired timing relationships and the timing relationships at said downstream node which arises due to thermal effects that occur when propagating a test signal having a duty cycle other than 50% through said signal path is reduced.

2. The buffer circuit of claim 1, wherein said signal path error correction circuit receives an input signal representing the error between said desired timing relationships and said timing relationships at said predetermined downstream node induced by the signal path followed by said test signal as it propagates to said predetermined downstream node, and varies said first error correction signal in accordance with said input signal.

3. The buffer circuit of claim 1, wherein said temperature-related error correction circuit receives an input signal representing said desired timing relationships, and varies said second error correction signal with said input signal such that the error between said desired timing relationships and the timing relationships at said downstream node which arises due to thermal effects that occur when propagating a test signal having a duty cycle other than 50% through said signal path is reduced.

4. The buffer circuit of claim 1, wherein said input is arranged to receive true and complement forms of said test signal and said delay circuit is arranged to produce true and complement forms of said propagated test signal at said output, said delay circuit comprising:

a first differential pair comprising first and second transistors having their control inputs connected to said true and complement forms of said test signal, respectively, and their current circuits connected to first and second current sources at first and second junctions, respectively, said first and second transistors arranged to conduct currents provided by said first and second current sources, respectively, in response to said true and complement forms of said test signal, a second differential pair comprising third and fourth transistors connected to said first and second junctions at their respective control inputs and to conduct respective currents in response to the voltages at said junctions, an output stage connected to receive respective voltages which vary with the currents conducted by said third and fourth transistors, respectively, and to provide said true and complement outputs in response, a first capacitor connected to the control input of said third transistor and arranged to linearize the slope of a transitioning signal at said first junction, a second capacitor connected to the control input of said fourth transistor and arranged to linearize the slope of a transitioning signal at said second junction, and a clamp circuit which receives said signal path and temperature-related duty cycle error correction signals and is connected to said first and second junctions at respective outputs, said clamp circuit arranged to, in response to said correction signals, establish respective upper and lower clamp voltages between which said first and second junctions are allowed to swing such that the durations of said rising and falling edge propagation delays vary with said correction signals.

5. The buffer circuit of claim 4, wherein said output stage comprises fifth and sixth transistors connected to receive said respective voltages which vary with the currents conducted by said third and fourth transistors at respective control inputs.

6. The buffer circuit of claim 4, wherein said signal path error correction circuit comprises:

a fixed current source which generates a first current, and a variable current source which receives an input signal representing the error between said desired timing relationships and said timing relationships at said predetermined downstream node induced by the signal path and generates a second current in response, said first and second currents comprising said first error correction signal, said clamp circuit arranged to vary said upper and lower clamp voltages with the difference between said first and second currents.

7. The buffer circuit of claim 4, wherein said signal path includes transistors which propagate said true and complement forms of said test signal and which have a characteristic thermal time constant, said temperature-related error correction circuit comprising:

a differential input which receives a signal representing said desired timing relationships, a resistive divider which produces an output voltage that varies with the differential voltage of the signal received at said differential input, an RC network which receives one side of said differential input and produces an output which varies with said desired timing relationships and has a time constant about equal to that of said characteristic thermal time constant, and a first differential pair comprising first and second transistors having their control inputs connected to said resistive divider and said RC network outputs, respectively, and arranged to conduct first and second currents to first and second output terminals, respectively, in response, said first and second currents comprising said second error correction signal.

8. The buffer circuit of claim 7, wherein said temperature-related error correction circuit further comprises a variable current source connected to bias said first differential pair, the magnitude of said bias current controlling the gain of said temperature-related error correction circuit, said variable current source arranged to receive a calibration signal and to vary said bias current with said calibration signal.

9. The buffer circuit of claim 7, wherein said temperature-related error correction circuit further comprises:
 a second differential pair of transistors having their control inputs connected to first and second gain control signals, respectively, and connected to conduct said first current to said first and second output terminals in accordance with said first and second gain control signals,
 a third differential pair of transistors having their control inputs connected to said first and second gain control signals, respectively, and connected to conduct said second current to said first and second output terminals in accordance with said first and second gain control signals, the currents at said first and second output terminals comprising said second error correction signal, and
 a gain control signal generation circuit which receives a calibration signal at an input and which produces said first and second gain control signals in response,
 said clamp circuit arranged to vary said upper and lower clamp voltages with the difference between the currents at said first and second output terminals.

10. The buffer circuit of claim 9, wherein said gain control signal generation circuit comprises:
 a fixed current source arranged to provide a first fixed current, said first fixed current comprising said first gain control signal,
 a variable current source which receives said calibration signal and is arranged to provide a variable current, said variable current comprising said second gain control signal, and
 a pair of bipolar transistors connected to conduct said first fixed current and said variable current to said fixed and variable current sources, respectively, thereby providing voltages on said gain control signal lines which vary with the log of the current conducted by said pair of bipolar transistors.

11. The buffer circuit of claim 4, wherein said clamp circuit comprises:
 a first subcircuit which provides said upper and lower clamp voltages for said first junction, and
 a second subcircuit which provides said upper and lower clamp voltages for said second junction, each of said subcircuits comprising:
  a first resistance connected on one side to a first node, said first node also connected to a supply voltage via a second resistance and to one of said error correction signals,
  a first current source connected to the other side of said first resistance to establish a differential voltage across said first resistance, and
  a buffer circuit connected across said first resistance which produces an output having a voltage swing which is proportional to said differential voltage, the upper and lower voltages of said voltage swing varying with said error correction signal, said upper and lower voltages being said subcircuit's upper and lower clamp voltages.

12. The buffer circuit of claim 1, wherein said test signal is periodic and said desired timing relationships between said test signal's rising and falling edges are said test signal's duty cycle.

13. The buffer circuit of claim 1, wherein said signal path has a rising edge propagation delay time TPDLH and a falling edge propagation delay time TPDHL, said buffer circuit arranged such that said delay circuit varies said rising and falling edge delays such that said signal path's TPDLH and TPDHL values are made equal.

14. The buffer circuit of claim 1, wherein said predetermined downstream node is said delay circuit output.

15. A buffer circuit for correcting signal path and temperature-related timing errors present in a propagating differential test signal, comprising:
 a signal path for conveying a test signal having true and complement forms to at least one predetermined downstream node, said test signal having associated desired timing relationships between its rising and falling edges,
 a delay circuit in said signal path arranged to propagate said test signal from an input to an output, comprising:
  a differential input connected to receive said true and complement forms of said test signal,
  a differential output, said delay circuit arranged to produce true and complement forms of said propagated test signal at said output,
  a first differential pair comprising first and second bipolar transistors having their bases connected to receive said true and complement forms of said test signal, respectively, and their collectors connected to first and second current sources at first and second junctions, respectively, said first and second transistors arranged to conduct currents provided by said first and second current sources, respectively, in response to said true and complement forms of said test signal,
  a second differential pair comprising third and fourth bipolar transistors connected to said first and second junctions at their respective bases and to conduct respective currents in response to the voltages at said junctions,
  an output stage connected to receive respective voltages which vary with the currents conducted by said third and fourth transistors, respectively, and to provide said true and complement outputs in response,
  a first capacitor connected to the control input of said third transistor and arranged to linearize the slope of a transitioning signal at said first junction,
  a second capacitor connected to the control input of said fourth transistor and arranged to linearize the slope of a transitioning signal at said second junction, and
  a clamp circuit which receives first and second error correction signals and is connected to said first and second junctions at respective outputs, said clamp circuit arranged to, in response to said correction signals, establish respective upper and lower clamp voltages between which said first and second junctions are allowed to swing to control the time at which said third and fourth transistors change state in response to transitioning signals at said first and second junctions, respectively, thereby controlling the propagation delays of said test signal's rising and falling edges through said delay circuit, said test signal propagated via said signal path from said delay circuit output to said at least one predetermined downstream node, said test signal having timing relationships at said predetermined downstream node, a signal path error correction circuit which receives an input signal representing the error between said desired timing relationships and said timing relationships at said predetermined downstream node induced by the signal path followed by said test signal as it propagates to said predetermined downstream node and produces said first error correction signal in response, and a temperature-related error correction circuit arranged to receive a signal representing said desired timing relationships and to produce said second error correction signal, said temperature-related error correction circuit arranged such that said second error correction signal varies with said signal representing said desired timing relationships such that the error between said desired timing relationships and the timing relationships at said downstream node which arises due to thermal effects that occur when propagating a test signal having a duty cycle other than 50% through said signal path is reduced.

16. The buffer circuit of claim 15, wherein said signal path includes transistors which propagate said true and complement forms of said test signal and which have a characteristic thermal time constant, said temperature-related duty cycle error correction circuit comprising:

a differential input which receives said signal representing said desired timing relationships, a resistive divider which produces an output voltage that varies with the differential voltage of the signal received at said differential input, an RC network which receives one side of said differential input and produces an output which varies with said desired timing relationships and has a time constant about equal to that of said characteristic thermal time constant, and a first differential pair comprising first and second transistors having their control inputs connected to said resistive divider and said RC network outputs, respectively, and arranged to conduct first and second currents to first and second output terminals, respectively, in response, a second differential pair of transistors having their control inputs connected to first and second gain control signals, respectively, and connected to conduct said first current to said first and second output terminals in accordance with said first and second gain control signals, a third differential pair of transistors having their control inputs connected to said first and second gain control signals, respectively, and connected to conduct said second current to said first and second output terminals in accordance with said first and second gain control signals, the currents at said first and second output terminals comprising said second duty cycle correction signal, and a gain control signal generation circuit which receives a calibration signal at an input and which produces said first and second gain control signals in response, said clamp circuit arranged to vary said upper and lower clamp voltages with the difference between the currents at said first and second output terminals.

17. The buffer circuit of claim 15, wherein said test signal is periodic and said desired timing relationships between said test signal's rising and falling edges are said test signal's duty cycle.

18. The buffer circuit of claim 15, wherein said signal path has a rising edge propagation delay time TPDLH and a falling edge propagation delay time TPDHL, said buffer circuit arranged such that said delay circuit varies said rising and falling edge delays such that said signal path's TPDLH and TPDHL values are made equal.

19. A method of correcting errors in the timing relationships between the rising and falling edges of a test signal incurred as said test signal propagates through a signal path, comprising:

receiving a test signal having associated desired timing relationships between its rising and falling edges at an input, propagating said test signal from said input to an output, said test signal having timing relationships between its rising and falling edges at said output, imposing a rising edge delay on the rising edges of said test signal as it propagates from said input to said output, imposing a falling edge delay on the falling edges of said test signal as it propagates from said input to said output, detecting the error between said desired timing relationships and said timing relationships at said output which is induced by the signal path followed by said test signal as it propagates from said input to said output, detecting the error between said desired timing relationships and said timing relationships at said output which is due to thermal effects that occur when propagating a test signal having a duty cycle other than 50% from said input to said output, adjusting said rising and falling edge delays to reduce said signal path-induced error, and adjusting said rising and falling edge delays to reduce said temperature-related error.

20. The method of claim 19, wherein said step of adjusting said rising and falling edge delays to reduce said signal path-induced error comprises:

applying a test signal having a first duty cycle of 50% at said input, monitoring the duty cycle of said test signal at said output, adjusting said rising and falling edge delays as needed to obtain a 50% duty cycle at said output.

21. The method of claim 19, wherein said step of adjusting said rising and falling edge delays to reduce said temperature-related error comprises:

applying a test signal having a first duty cycle other than 50% at said input, monitoring the duty cycle of said test signal at said output, adjusting said rising and falling edge delays as needed to obtain a duty cycle at said output equal to said first duty cycle.

* * * * *